United States Patent
Zheng et al.

(10) Patent No.: US 9,882,354 B2
(45) Date of Patent: Jan. 30, 2018

(54) SEMICONDUCTOR LASER DEVICE

(71) Applicant: HAMAMATSU PHOTONICS K.K., Shizuoka (JP)

(72) Inventors: Yujin Zheng, Hamamatsu (JP); Hirofumi Kan, Shizuoka (JP)

(73) Assignee: HAMAMATSU PHOTONICS K.K., Hamamatsu-shi, Shizuoka (JP)

(*) Notice: Subject to any disclaimer, the term of this patent is extended or adjusted under 35 U.S.C. 154(b) by 0 days.

(21) Appl. No.: 15/124,778

(22) PCT Filed: Mar. 3, 2015

(86) PCT No.: PCT/JP2015/056241
§ 371 (c)(1),
(2) Date: Sep. 9, 2016

(87) PCT Pub. No.: WO2015/137199
PCT Pub. Date: Sep. 17, 2015

(65) Prior Publication Data
US 2017/0033537 A1    Feb. 2, 2017

(30) Foreign Application Priority Data
Mar. 12, 2014 (JP) ................................. 2014-048593

(51) Int. Cl.
*H01S 5/00* (2006.01)
*H01S 5/40* (2006.01)
(Continued)

(52) U.S. Cl.
CPC ........ *H01S 5/4062* (2013.01); *H01S 5/02438* (2013.01); *H01S 5/141* (2013.01);
(Continued)

(58) Field of Classification Search
CPC .. H01S 5/4062; H01S 5/4025; H01S 5/02438; H01S 5/42; H01S 5/141; H01S 5/405; H01S 5/10
See application file for complete search history.

(56) References Cited

U.S. PATENT DOCUMENTS 5,572,542 A    11/1996  Dixon
6,212,216 B1    4/2001  Pillai
(Continued)

FOREIGN PATENT DOCUMENTS

JP    H2-237089    9/1990
JP    H6-500432    1/1994
(Continued)

OTHER PUBLICATIONS

International Preliminary Report on Patentability dated Sep. 22, 2016 for PCT/JP2015/056241.
(Continued)

*Primary Examiner* — Yuanda Zhang
(74) *Attorney, Agent, or Firm* — Drinker Biddle & Reath LLP

(57) ABSTRACT

A semiconductor laser device includes: a semiconductor laser array in which a plurality of active layers that emit laser lights with a divergence angle $\theta_S$ (>4°) in a slow axis direction are arranged; a first optical element that reflects first partial lights by a first reflecting surface and returns the first partial lights to the active layers; and a second optical element that reflects partial mode lights of second partial lights by a second reflecting surface and returns the partial mode lights to the active layers, the first reflecting surface forms an angle equal to or greater than 2° and less than ($\theta_S/2$) with a plane perpendicular to an optical axis direction of the active layers, and the second reflecting surface forms an angle greater than ($-\theta_S/2$) and equal to or less than $-2°$
(Continued)

with the plane perpendicular to the optical axis direction of the active layers.

2 Claims, 7 Drawing Sheets

(51) Int. Cl.
    *H01S 5/42*     (2006.01)
    *H01S 5/024*     (2006.01)
    *H01S 5/14*     (2006.01)
    *H01S 5/10*     (2006.01)

(52) U.S. Cl.
    CPC ............ *H01S 5/405* (2013.01); *H01S 5/4025* (2013.01); *H01S 5/42* (2013.01); *H01S 5/10* (2013.01)

(56) References Cited

U.S. PATENT DOCUMENTS

| | | | | |
|---|---|---|---|---|
| 2006/0140242 A1* | 6/2006 | Mikhailov | .......... | H01S 3/08059 372/99 |
| 2007/0064754 A1* | 3/2007 | Zheng | ................ | G02B 27/0961 372/43.01 |
| 2007/0291812 A1* | 12/2007 | Petersen | ................ | H01S 5/148 372/103 |
| 2013/0121360 A1* | 5/2013 | Trela | ..................... | H01S 5/4062 372/50.11 |

FOREIGN PATENT DOCUMENTS

| | | |
|---|---|---|
| JP | H6-045696 | 2/1994 |
| JP | 2004-186233 A | 7/2004 |
| JP | 2004-281890 A | 10/2004 |
| JP | 2005-522039 A | 7/2005 |
| JP | 2005-537642 A | 12/2005 |
| JP | 2007-207886 A | 8/2007 |
| JP | 4002286 | 10/2007 |
| JP | 2008-111843 | 5/2008 |
| WO | WO-03/084006 A2 | 10/2003 |
| WO | WO-2004/021524 A2 | 3/2004 |

OTHER PUBLICATIONS

D. Paboeuf et al., "Narrow-line coherently combined tapered laser diodes in a Talbot external cavity with a volume Bragg grating", Applied Physics Letters, 2008, p. 211102-1-p. 211102-3, 93, 211102.

Su Zhouping et al., Beam quality improvement of laser diode array by using off-axis external cavity References and links, Rev, Sci. Instrum Appl. Phys. Lett. Paraxial Appl. Phys. Lett, vol. 15, No. 19, 2007, pp. 11776-11780, XP055419586.

\* cited by examiner (a)

(b)

SEMICONDUCTOR LASER DEVICE

TECHNICAL FIELD

An aspect of the present invention relates to an external resonator-type semiconductor laser device.

BACKGROUND ART

In the related art, for example, as described in Patent Literature 1, an external resonator-type semiconductor laser device including a semiconductor laser array in which a plurality of active layers are arranged in a slow axis direction, a collimating lens that collimates laser lights emitted from each of the active layers in a plane perpendicular to the slow axis direction, a first optical element that reflects partial lights advancing to one side in the slow axis direction from among the laser lights emitted from the collimating lens and returns the partial lights to each of the active layers, and a second optical element that reflects partial lights advancing to the other side in the slow axis direction from among the laser lights emitted from the collimating lens and returns the partial lights to each of the active layers is known.

CITATION LIST

Patent Literature

Patent Literature 1: Japanese Unexamined Patent application Publication No. 2007-207886

SUMMARY OF INVENTION

Technical Problem

In the semiconductor laser device described in Patent Literature 1, it is intended to decrease a divergence angle in the slow axis direction of the laser lights emitted from the semiconductor laser array by arranging a reflecting surface of the first optical element to be inclined several degrees from a plane perpendicular to optical axes of each of the active layers. In the semiconductor laser device described in Patent Literature 1, it is intended to decrease a spectrum width of the laser lights emitted from the semiconductor laser array by using a wavelength selecting element that reflects a laser light of a specific wavelength as the first and second optical elements.

In this way, in the above-mentioned semiconductor laser device, for example, there is a need for improvement in beam quality such as a decrease in the divergence angle in the slow axis direction or a decrease in the spectrum width.

An object of an aspect of the present invention is to provide a semiconductor laser device that can improve beam quality.

Solution to Problem

According to an aspect of the present invention, there is provided a semiconductor laser device including: a semiconductor laser array in which a plurality of active layers that emit laser lights at a divergence angle $\theta_S$ (>4°) with a slow axis direction are arranged in the slow axis direction; a collimating lens that collimates the laser lights emitted from each of the active layers in a plane perpendicular to the slow axis direction; a first optical element that reflects first partial lights advancing to one side in the slow axis direction from among each of the laser lights emitted from the collimating lens by a first reflecting surface and returns the first partial lights to each of the active layers via the collimating lens; and a second optical element that reflects a part of the mode lights of a plurality of mode lights of second partial lights advancing to the other side in the slow axis direction from among each of the laser lights emitted from the collimating lens by a second reflecting surface and returns the part of the mode lights to each of the active layers via the collimating lens, wherein the first optical element is disposed such that the first reflecting surface forms an angle equal to or greater than 2° and less than ($\theta_S/2$) with respect to a plane perpendicular to an optical axis direction of the active layers, and the second optical element is disposed such that the second reflecting surface forms an angle greater than ($-\theta_S/2$) and equal to or less than $-2°$ with respect to the plane perpendicular to the optical axis direction of the active layers.

According to the semiconductor laser device, the first partial lights are reflected by the first reflecting surface of the first optical element, and are returned to each of the active layers via the collimating lens. A part of the second partial lights is reflected by the second reflecting surface of the second optical element and returned to each of the active layers via the collimating lens. Accordingly, laser lights are amplified by the active layers while reciprocating between the first optical element and the second optical element. At this time, since the first reflecting surface forms an angle equal to or greater than 2° and less than ($\theta_S/2$) and the second reflecting surface forms an angle greater than ($-\theta_S/2$) and equal to or less than $-2°$, it is possible to decrease the divergence angle in the slow axis direction of the amplified laser lights. Since partial mode lights of the plurality of mode lights of the second partial lights are reflected by the second reflecting surface, the partial mode lights are selectively amplified. Accordingly, it is possible to further decrease the divergence angle in the slow axis direction of a laser light. In this way, according to the semiconductor laser device, it is possible to improve beam quality.

In the semiconductor laser device according to the aspect of the present invention, the first optical element may be a wavelength selecting element that selectively reflects lights having a specific wavelength from among the first partial lights by the first reflecting surface and returns the lights having the specific wavelength to each of the active layers via the collimating lens. Accordingly, laser lights having a specific wavelength are amplified by the active layers and reciprocate at least between the first optical element and the active layers. As a result, it is possible to reduce a spectrum width of a laser light output to the outside.

In the semiconductor laser device according to the aspect of the present invention, the second optical element may be disposed in an optical path of zeroth-order mode lights from among the plurality of mode lights of the second partial lights to reflect the zeroth-order mode lights by the second reflecting surface and to return the zeroth-order mode lights to each of the active layers via the collimating lens. Accordingly, it is possible to efficiently amplify a zeroth-order mode light.

Advantageous Effects of Invention

According to the aspect of the present invention, it is possible to provide a semiconductor laser device that can improve beam quality.

DESCRIPTION OF EMBODIMENTS

Figure 1:
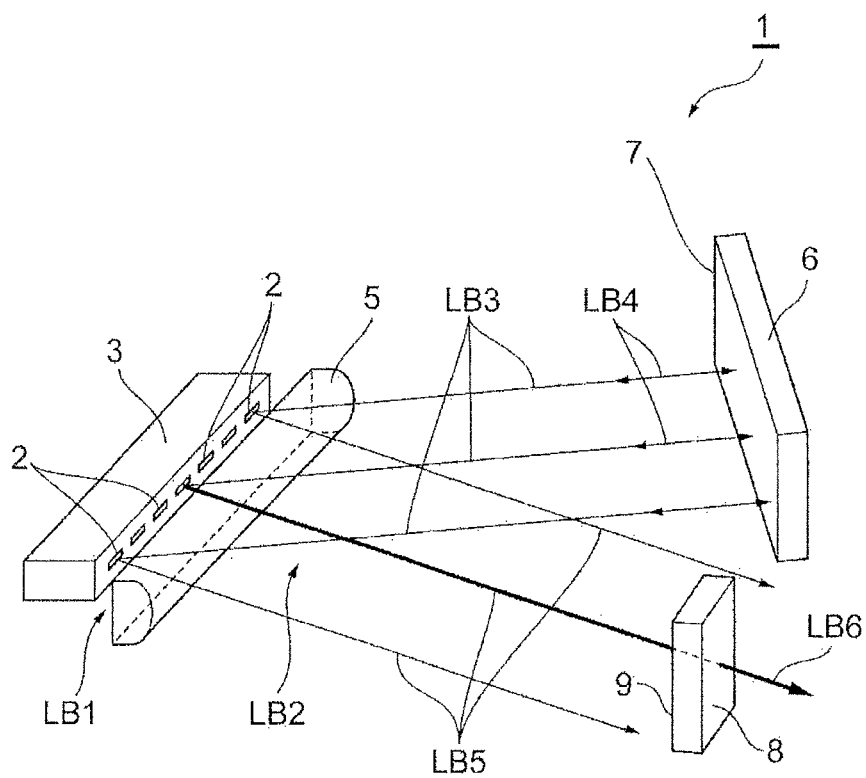
FIG. 1 is a perspective view schematically illustrating a semiconductor laser device according to an embodiment.

Hereinafter, an embodiment of a semiconductor laser device according to an aspect of the present invention will be described in detail with reference to the accompanying drawings. For the purpose of convenience, identical or corresponding elements in the drawings will be referenced by the same reference signs and description thereof will not be repeated. The dimensional ratios of the drawings may be exaggerated for explanation and are not necessarily equal to actual dimensional ratios. An orthogonal coordinate system C is illustrated in the drawings.

Figure 2:
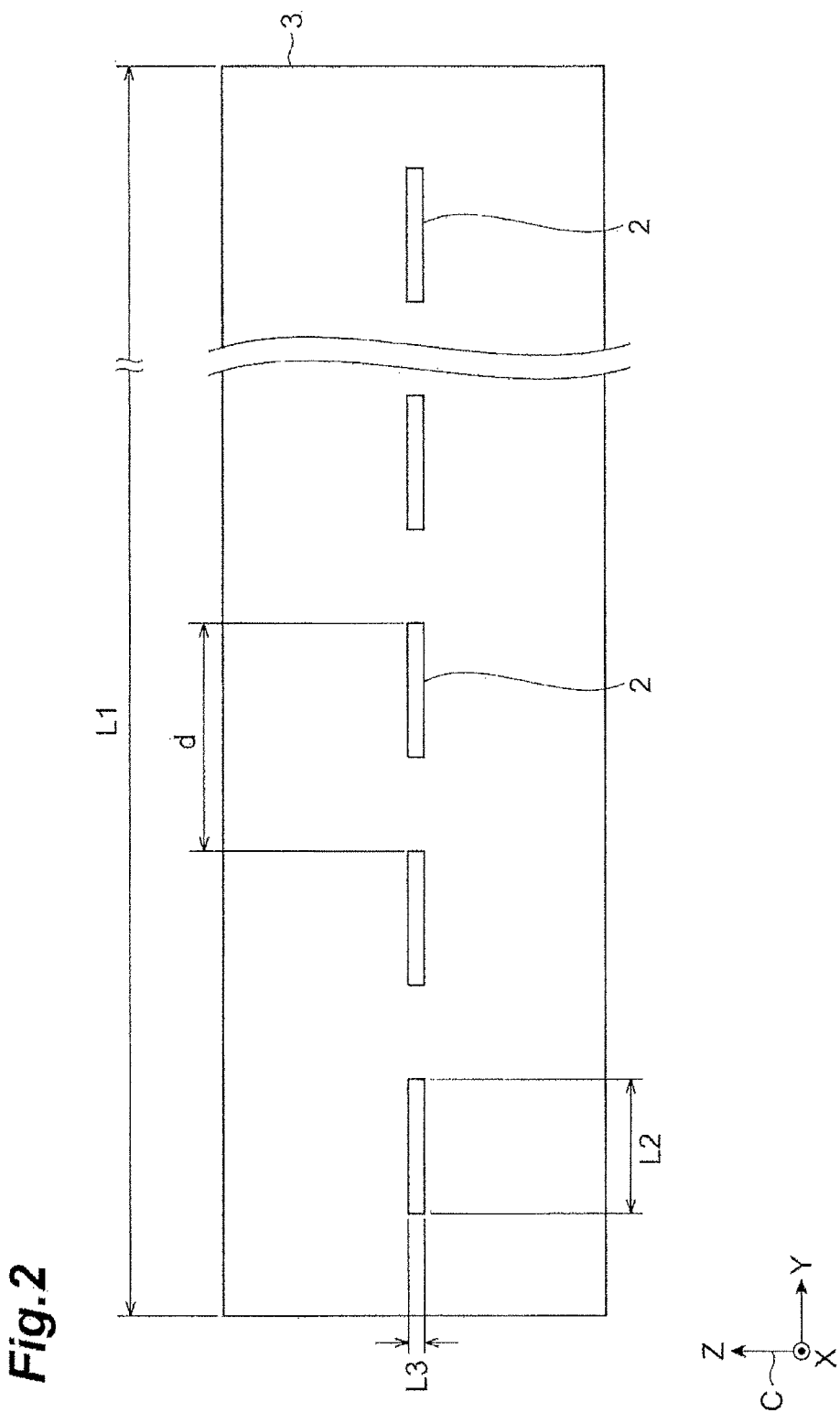
FIG. 2 is a front view of a laser array in the semiconductor laser device illustrated in FIG. 1.

As illustrated in FIGS. 1 and 2, a semiconductor laser device 1 includes a semiconductor laser array 3 in which a plurality of active layers 2 are arranged in the slow axis direction with an X-axis direction as an optical axis direction, a Y-axis direction as a slow axis direction, and a Z-axis direction as a fast axis direction. The semiconductor laser array 3 has a rectangular parallelepiped shape which is thin and long in the slow axis direction and has a predetermined length L1 (for example, about 10 mm) in the slow axis direction. The active layers 2 are arranged at a predetermined pitch d (for example, about 200 μm to 500 μm) in the slow axis direction. Each active layer 2 has a predetermined width L2 (for example, about 100 μm to 200 μm) in the slow axis direction and a predetermined thickness L3 (for example, about 1 μm) in the fast axis direction.

Figure 3:
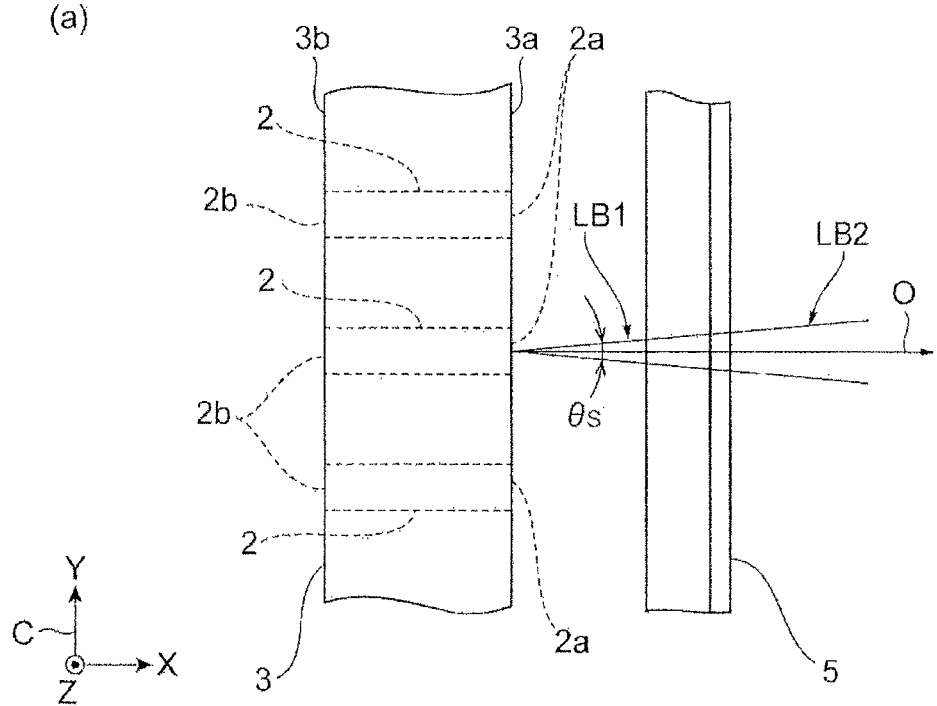
FIG. 3(a) is a partial plan view of the semiconductor laser device illustrated in FIG. 1
FIG. 3(b) is a partial side view thereof.
Figure 3:
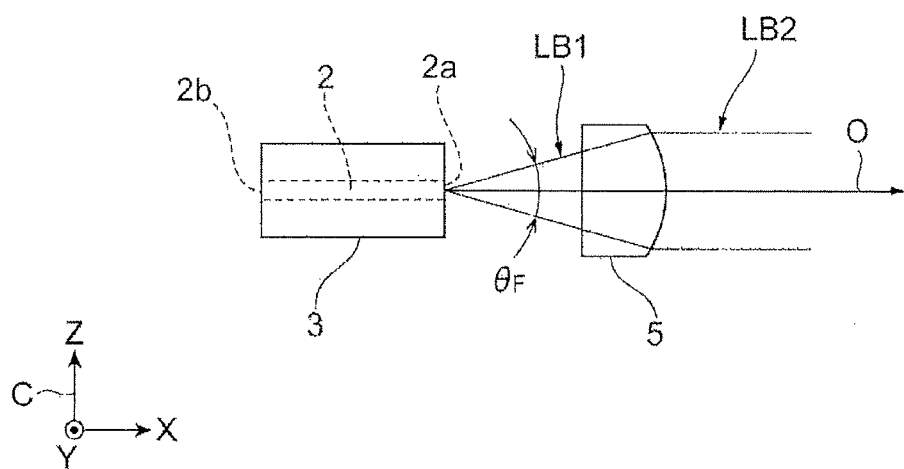

As illustrated in FIG. 3, a front end face 2a of each active layer 2 reaches a front end face 3a of the semiconductor laser array 3. An anti-reflection (AR) film is formed on the front end face 2a of each active layer 2. On the other hand, a rear end face 2b of each active layer 2 reaches a rear end face 3b of the semiconductor laser array 3. A high-reflection (RR) film is formed on the rear end face 2b of each active layer 2.

Laser lights LB1 emitted to the front side from the front end face 2a of each active layer 2 have a divergence angle $\theta_S$ in the slow axis direction and a divergence angle $\theta_F$ in the fast axis direction with respect to an optical axis O of the active layer 2 as a center. The divergence angle $\theta_S$ in the slow axis direction is, for example, larger than 4° (for example, 8° to 10°). The divergence angle $\theta_F$ in the fast axis direction ranges, for example, from 30° to 40°. In this way, since the divergence angle $\theta_F$ in the fast axis direction is relatively large in the laser light emitted from each active layer 2, a collimating lens 5 is disposed in front of the semiconductor laser array 3 in order to suppress the divergence angle $\theta_F$ in the fast axis direction.

The collimating lens 5 is, for example, a cylindrical lens having a shape which is thin and long in the slow axis direction. For example, the collimating lens 5 has a length of about 0.4 mm in the optical axis direction of each active layer 2, a length of about 12 mm in the slow axis direction, and a length of about 0.6 mm in the fast axis direction. The collimating lens 5 does not have a refracting operation in a plane perpendicular to the fast axis direction (that is, an XY plane), but has a refracting operation in a plane perpendicular to the slow axis direction (That is, a ZX plane). That is, the collimating lens 5 refracts laser lights LB1 emitted from each active layer 2 of the semiconductor laser array 3 in the plane perpendicular to the slow axis direction and emits laser lights LB2 collimated in the fast axis direction.

Figure 4:
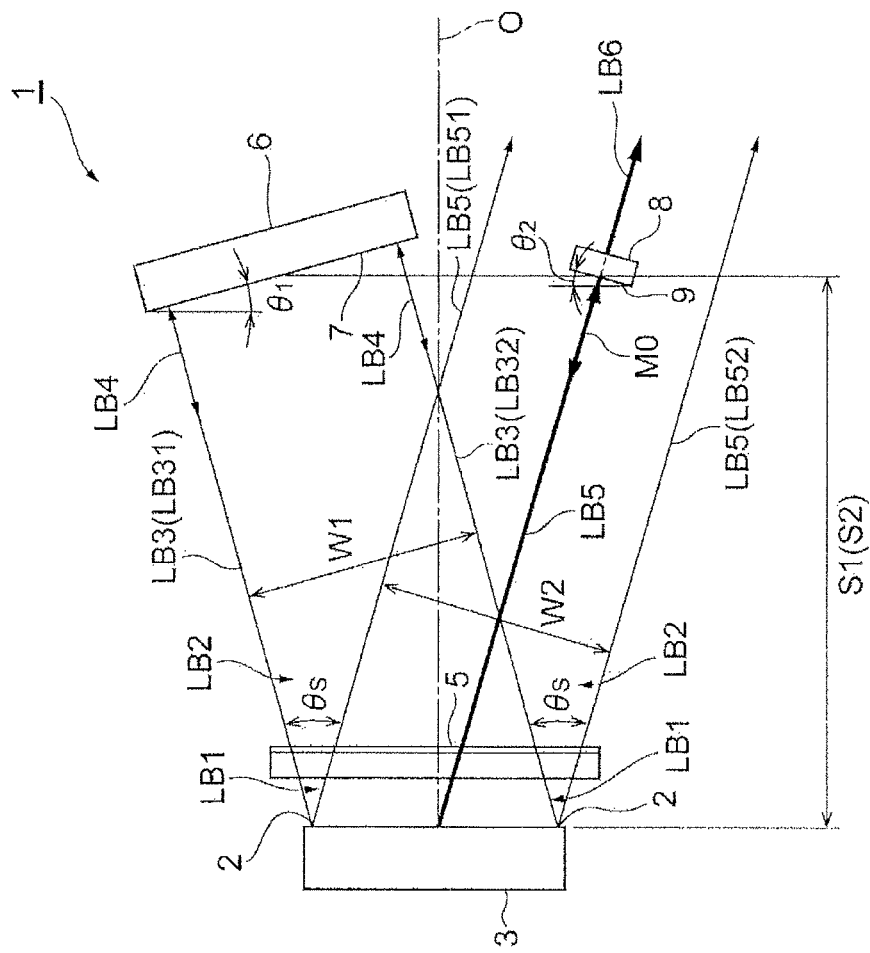
FIG. 4 is a plan view of the semiconductor laser device illustrated in FIG. 1.

As illustrated in FIG. 4, on the front side of the collimating lens 5, a plane mirror (a first optical element) 6 is disposed on one side in the slow axis direction (on the left side in a laser light emission direction in this embodiment) with respect to the optical axis O. The plane mirror 6 reflects first partial lights LB3 advancing to one side in the slow axis direction of the laser lights LB2 emitted from the collimating lens 5 by a reflecting surface (a first reflecting surface) 7 and returns the first partial light as laser lights LB4 to the active layer 2 via the collimating lens 5.

The first partial lights LB3 are laser lights advancing between a laser light LB31 advancing to one side in the slow axis direction from the active layer 2 disposed at an end on one side in the slow axis direction in the semiconductor laser array 3 and a laser light LB32 advancing to one side in the slow axis direction from the active layer 2 disposed at an end on the other side in the slow axis direction in the semiconductor laser array 3 from among all of the laser lights LB2.

More specifically, for example, when the divergence angle $\theta_S$ in the slow axis direction of the laser lights LB2 ranges from 8° to 10°, the laser lights LB31 and LB32 advance with an inclination of 4' to 5° to one side in the slow axis direction with respect to the optical axis of the active layers 2. The first partial lights LB3 are laser lights advancing in a range which is defined by a pair of parallel lines corresponding to the laser lights LB31 and LB32. Accordingly, the first partial lights LB3 advance with a predetermined width W1. The width W1 of the first partial lights LB3 corresponds to a pitch between the active layer 2 disposed at an end on one side in the slow axis direction in the semiconductor laser array 3 and the active layer 2 disposed at an end on the other side.

A reflecting surface 7 of the plane mirror 6 has a characteristic of reflecting the first partial lights LB3 with reflectance of 90% or more. The width of the reflecting surface 7 of the plane mirror 6 is greater than the width W1 of the first partial lights LB3 and is, for example, about 12 mm.

The plane mirror 6 is disposed such that a distance S1 from the center in the slow axis direction of the reflecting surface 7 to the front end face 3a of the semiconductor laser array 3 (the front end faces 2a of the active layers 2) satisfies Equation (1). Accordingly, a Talbot resonator is constituted between the reflecting surface 7 of the plane mirror 6 and the front end faces 2a of each of the active layers 2.

$$S1 = (1/4)Zt, (1/2)Zt, Zt, \quad (1)$$

Here, Zt denotes a Talbot distance and is expressed by Equation (2).

$$Zt = 2d^2/\lambda \quad (2)$$

Here, λ denotes a center wavelength of the laser lights LB1 emitted from the semiconductor laser array 3, and d denotes the pitch d of the active layers 2 in the semiconductor laser array 3. In this embodiment, for example, when the center wavelength λ is about 927 nm and the pitch d is about 500 µm, the reflecting surface 7 is disposed at a position of S1=(¼)Zt≈135 mm.

In front of the collimating lens 5, a plane mirror (second optical element) 8 is disposed on the other side in the slow axis direction (the right side in the laser light emitting direction in this embodiment) with respect to the optical axis O. The plane mirror 8 reflects a part of second partial lights LB5 advancing to the other side in the slow axis direction of the laser lights LB2 emitted from the collimating lens 5 by a reflecting surface (a second reflecting surface) 9 and returns the part of the second partial lights LB5 to the active layers via the collimating lens 5.

The second partial lights LB5 are laser lights advancing in an area between a laser light LB51 advancing from the active layer 2 disposed at an end on one side in the slow axis direction in the semiconductor laser array 3 to the other side in the slow axis direction and a laser light LB52 advancing from the active layer 2 disposed at an end on the other side in the slow axis direction in the semiconductor laser array 3 to the other side in the slow axis direction from among all of the laser lights LB2.

More specifically, for example, when the divergence angle $\theta_S$ in the slow axis direction of the laser lights LB2 ranges from 8° to 10°, the laser lights LB51 and LB52 advance with an inclination of 4° to 5° to the other side in the slow axis direction with respect to the optical axis of the active layers 2. The second partial lights LB5 are laser lights advancing in a range which is defined by a pair of parallel lines corresponding to the laser lights LB51 and LB52. Accordingly, the second partial lights LB5 advance with a predetermined width W2. The width W2 of the second partial lights LB5 corresponds to a pitch between the active layer 2 disposed at an end on one side in the slow axis direction in the semiconductor laser array 3 and the active layer 2 disposed at an end on the other side.

The reflecting surface 9 of the plane mirror 8 is formed to have a width smaller than the width W2 of the second partial lights LB5. Accordingly, the reflecting surface 9 reflects only a part of the second partial lights LB5. In this embodiment, the reflecting surface 9 of the plane mirror 8 has a width of, for example, about 500 µm and is disposed at substantially the center in the width direction of the second partial lights LB5. Accordingly, the reflecting surface 9 of the plane mirror 8 can reflect only the lights of the central portion in the width direction of the second partial lights LB5. The reflecting surface 9 of the plane mirror 8 has a characteristic of reflecting the incident lights with reflectance of about 10% to 30% and transmitting the other lights to the outside.

The plane mirror 8 is disposed such that a distance S2 from the center in the slow axis direction of the reflecting surface 9 to the front end face 3a of the semiconductor laser array 3 (the front end faces 2a of the active layers 2) satisfies Equation (3). Accordingly, a Talbot resonator is constituted between the reflecting surface 9 of the plane mirror 8 and the front end faces 2a of each of the active layers 2.

$$S2 \geq (¼)Zt \quad (3)$$

In this embodiment, the distance S2 at which the reflecting surface 9 is disposed is about 135 mm from the front end face 3a of the semiconductor laser array 3 (the front end faces 2a of the active layers 2) and is the same distance as the plane mirror 6.

The plane mirror 6 is disposed such that the reflecting surface 7 forms an angle $\theta_1$ (with the fast axis direction as a rotation axis) with respect to a plane (that is, the YZ plane) perpendicular to the optical axis direction of the active layers 2. The plane mirror 8 is disposed such that the reflecting surface 7 forms an angle $\theta_2$ (with the fast axis direction as a rotation axis) with respect to the plane perpendicular to the optical axis direction of the active layers 2. Here, the angle $\theta_1$ is equal to or greater than 2° and less than ($\theta_S/2$) and the angle $\theta_2$ is greater than ($-\theta_S/2$) and equal to or less than −2°. More specifically, for example, when the divergence angle $\theta_S$ is 10°, the angle $\theta_1$ is equal to or greater than 2° and less than 5° and the angle $\theta_2$ is greater than −5° and equal to or less than −2°. For example, the angle $\theta_1$ is equal to or greater than 2° and equal to or less than 3° and the angle $\theta_2$ is equal to or greater than −3' and equal to or less than −2°. The absolute value of the angle $\theta_1$ and the absolute value of the angle $\theta_2$ may be equal to each other.

An operation of the semiconductor laser device 1 having the above-mentioned configuration will be described below.

First, laser lights LB1 are emitted to the front side from each of the active layers 2 of the semiconductor laser array 3. The laser lights LB1 have a divergence angle $\theta_S$ of about 8° to 10° in the slow axis direction, for example, with the optical axis of the active layers 2 as a center, and have a divergence angle $\theta_F$ of 30° to 40° in the fast axis direction. The laser lights LB1 emitted from each of the active layers 2 are incident on the collimating lens 5 and are collimated in the plane perpendicular to the slow axis direction. Accordingly, the laser lights LB2 in which the divergence angle $\theta_S$ in the slow axis direction ranges from 8° to 10° and the divergence angle $\theta_F$ in the fast axis direction is about 0° are emitted to the front side from the collimating lens 5.

Figure 5:
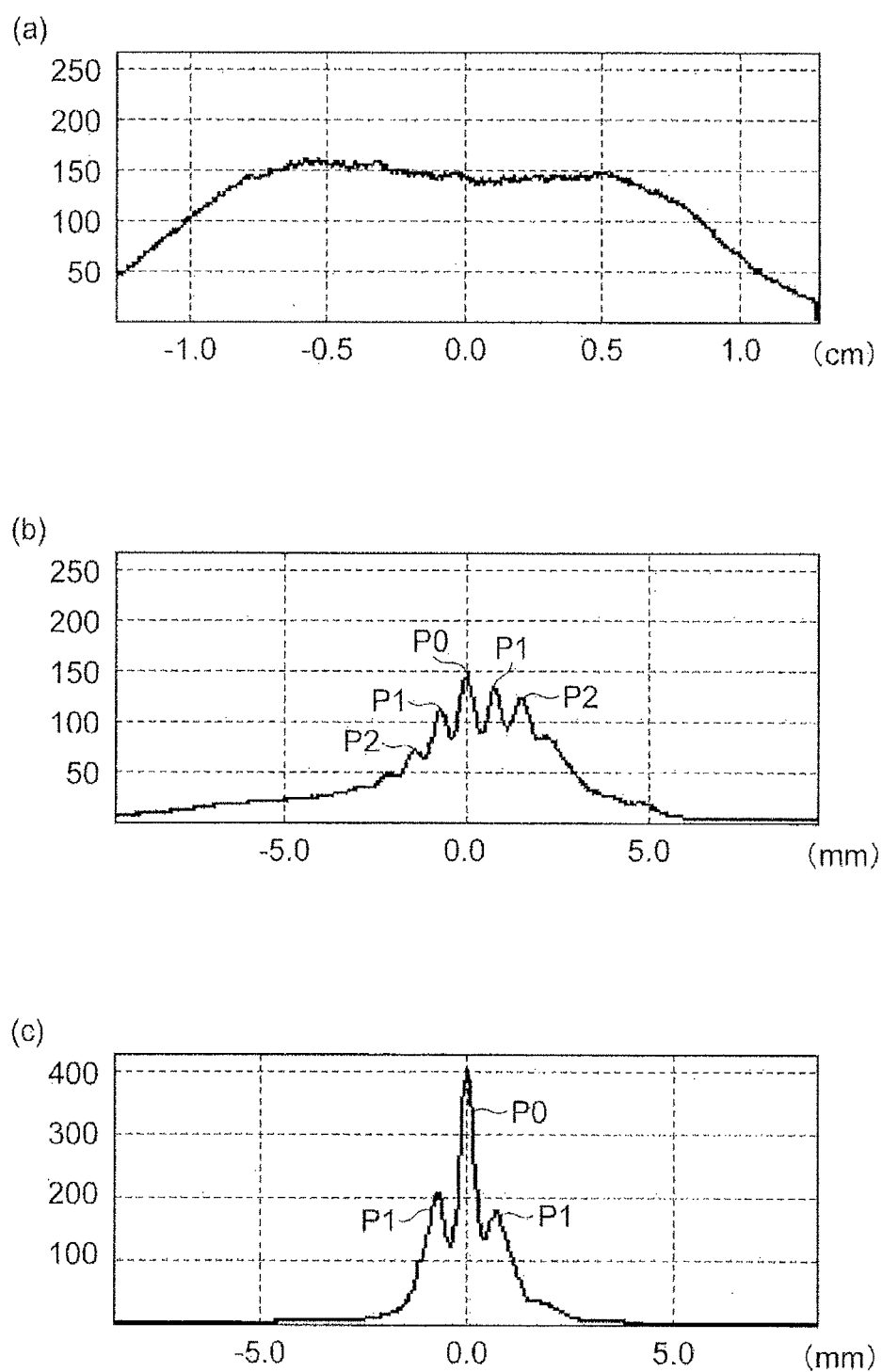
FIGS. 5(a) to 5(c) are diagrams illustrating beam profiles at positions of the semiconductor laser device illustrated in FIG. 1.

FIGS. 5(a) to 5(c) illustrate beam profiles of laser lights at positions of the semiconductor laser device 1, where the horizontal axis represents a distance from the center in the slow axis direction of the laser lights and the vertical axis represents the intensity of the laser lights. As illustrated in FIG. 5(a), the beam profile of the laser lights LB2 has a smooth shape in which no remarkable peak appears. The divergence angle in the slow axis direction of the laser lights LB2 at this time, for example, from 8° to 10° as described above. The spectrum width of the laser lights LB2 is about several nm.

As illustrated in FIG. 4, the first partial lights LB3 advancing to one side in the slow axis direction and substantially vertically incident on the reflecting surface 7 of the plane mirror 6 from among each of the laser lights LB2 emitted from the collimating lens 5 are reflected in a direction substantially opposite to the reflecting surface 7. Then, the laser lights LB4 reflected by the reflecting surface 7 advance reversely in the optical path extending from the active layers 2 to the reflecting surface 7 and are returned to each of the active layers 2. Accordingly, the laser lights LB4 returned to each of the active layers 2 are amplified by the active layers 2 and are emitted again to the front side from the active layers 2. In this way, a part of the laser lights LB1 emitted from each of the active layers 2 is amplified by the active layers 2 and reciprocates between the plane mirror 6 and the active layers 2. At this time, since the reflecting surface 7 and the active layers 2 of the semiconductor laser array 3 have the above-mentioned relationship, the laser lights LB4 decrease in the divergence angle in the slow axis direction.

As illustrated in FIG. 5(b), the beam profile of the laser lights LB4 reciprocating between the plane mirror 6 and the active layers 2 has a plurality of peaks which decrease in intensity from the center to the outside. The peak P0 at the center in the slow axis direction of the laser lights LB4 is a peak based on a zeroth-order mode light M0, and the peaks P1 on both sides of the peak P0 are peaks based on a first-order mode light. A pair of peaks P2 based on a second-order mode light appear outside the peaks P1. No remarkable peak appears outside the peaks P2, and the intensity decreases quickly. The divergence angle in the slow axis direction of the laser lights LB4 having such a beam profile is smaller than the divergence angle in the slow axis direction of the laser lights LB1 and is, for example, about 1°.

As illustrated in FIG. 4, a part of the laser lights LB4 which are amplified while reciprocating between the plane mirror 6 and the active layers 2 advances as the second partial lights LB5 to the other side in the slow axis direction. The position at which the plane mirror 8 is disposed is substantially the center in the width direction of the optical path of the second partial lights LB5 and is in the optical path of the zeroth-order mode lights M0. Therefore, mainly, the zeroth-order mode lights M0 from among a plurality of mode lights of the second partial lights LB5 are incident substantially vertically on the reflecting surface 9, are reflected in substantially the opposite direction, and are returned to each of the active layers 2. Accordingly, the second partial lights LB5 returned to each of the active layers 2 are amplified while centered on the zeroth-order mode lights M0 by each of the active layers 2 and are emitted again to the front side from the active layers 2.

Accordingly, the second partial lights LB5 with very high coherency are obtained. The laser lights LB6 which are not reflected by the plane mirror 8 from among the second partial lights LB5 are output to the outside. As illustrated in FIG. 5(c), in the beam profile of the laser lights LB6 output to the outside, the peak P0 at the center based on the zeroth-order mode lights M0 is selectively amplified and a difference between the intensity of the peak P0 and the intensity of the peaks P1 based on the first-order mode lights increases. No peaks based on the second-order mode light (the peaks P2 in FIG. 5(b)) appear and the intensity decreases quickly outside the peaks P1. The divergence angle of the laser lights LB6 having such a beam profile is less than the divergence angle in the slow axis direction of the laser lights LB4 (that is, the second partial lights LB5 reciprocating between the plane mirror 6 and the active layers 2 and then first reaching the reflecting surface 9) reciprocating between the plane mirror 6 and the active layers 2 and is, for example, equal to or less than about 0.3°.

As described above, in the semiconductor laser device 1, the first partial lights LB3 are reflected by the reflecting surface 7 of the plane mirror 6 and are returned to each of the active layers 2 via the collimating lens 5. A part of the second partial lights LB5 are reflected by the reflecting surface 9 of the plane mirror 8 and are returned to each of the active layers 2 via the collimating lens 5. Accordingly, the laser lights are amplified by the active layers 2 while reciprocating between the plane mirror 6 and the plane mirror 8.

At this time, since the reflecting surface 7 forms the angle equal to or greater than 2° and less than ($\theta_S/2$) and the plane mirror 8 forms the angle greater than ($-\theta_S/2$) and equal to or less than −2°, it is possible to decrease the divergence angle in the slow axis direction of the amplified laser lights LB4 and the second partial lights LB5. Since the zeroth-order mode lights M0 from among the second partial lights LB5 are mainly reflected by the reflecting surface 9, the zeroth-order mode lights M0 are selectively amplified. Accordingly, it is possible to further decrease the divergence angle in the slow axis direction of the laser lights LB6 (that is, it is possible to obtain beams with very high coherency). In this way, according to the semiconductor laser device 1, it is possible to improve beam quality.

In the semiconductor laser device 1, because the plane mirror 8 is in the optical path of the zeroth-order mode lights M0 (at substantially the center in the width direction of the optical path of the second partial lights LB5) to mainly reflect the zeroth-order mode lights M0 by the reflecting surface 9, it is possible to efficiently amplify the zeroth-order mode lights.

While an embodiment of an aspect of the present invention has been described above, the aspect of the present invention is not limited to the above-mentioned embodiment.

Figure 6:
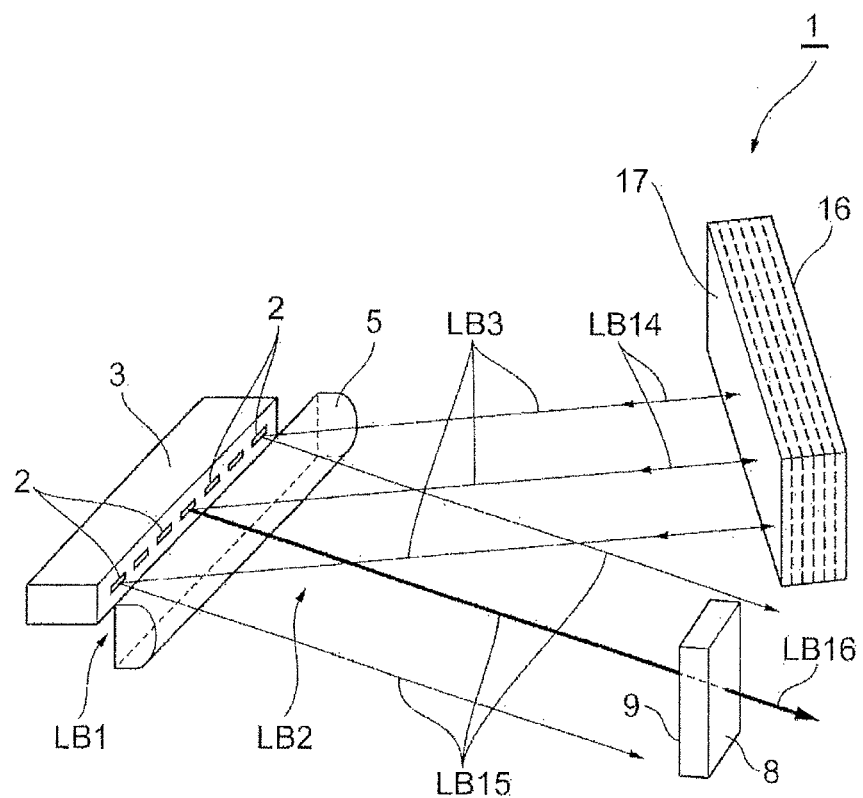
FIG. 6 is a perspective view schematically illustrating a modified example of the semiconductor laser device illustrated in FIG. 1.

For example, in the above-mentioned embodiment, the first partial lights LB3 advancing to one side in the slow axis direction from among the laser lights LB2 emitted from the collimating lens 5 are reflected by the reflecting surface 7 of the plane mirror 6, but the present invention is not limited to this example. As illustrated in FIG. 6, a wavelength selecting element (the first optical element) 16 that selectively reflects laser lights LB14 having a specific wavelength from among the first partial lights LB3 by a reflecting surface (the first reflecting surface) 17 and returns the laser lights LB14 to each of the active layers 2 via the collimating lens 5 may be used instead of the plane mirror 6.

For example, the wavelength selecting element 16 has a characteristic of reflecting the laser lights of a specific wavelength (for example, the center wavelength (for example, about 927 nm) of the laser lights LB14) with high reflectance (for example, reflectance of 90% or more) in a Bragg reflection manner and not reflecting most laser lights of other wavelengths. LuxxMaster™ (Volume Bragg Grating) made by PD-LD Inc. is known as such as wavelength selecting element.

In this case, the laser lights LB14 of a specific wavelength are amplified by the active layers 2 and reciprocate between the wavelength selecting element 16 and the active layers 2. Accordingly, the spectrum width of the laser lights LB15 advancing to the other side in the slow axis direction also decreases. As a result, it is possible to enhance coherency of laser lights L16 output to the outside and to decrease the spectrum width of the laser lights L16.

A reflective refraction grating may be used as the wavelength selecting element 16. In the reflective refraction grating; a plurality of parallel grooves having a sawtooth cross-sectional shape are formed on a glass substrate having a reflecting film formed on the surface thereof. The reflective refraction grating can selectively reflect the center wavelength of the laser lights LB14 by finely adjusting the angle with the incident laser lights LB14. Accordingly, it is possible to enhance the coherency of the laser lights L16 output to the outside and to decrease the spectrum width of the laser lights L16 by selectively amplifying wavelength components of the center wavelength.

Figure 7:
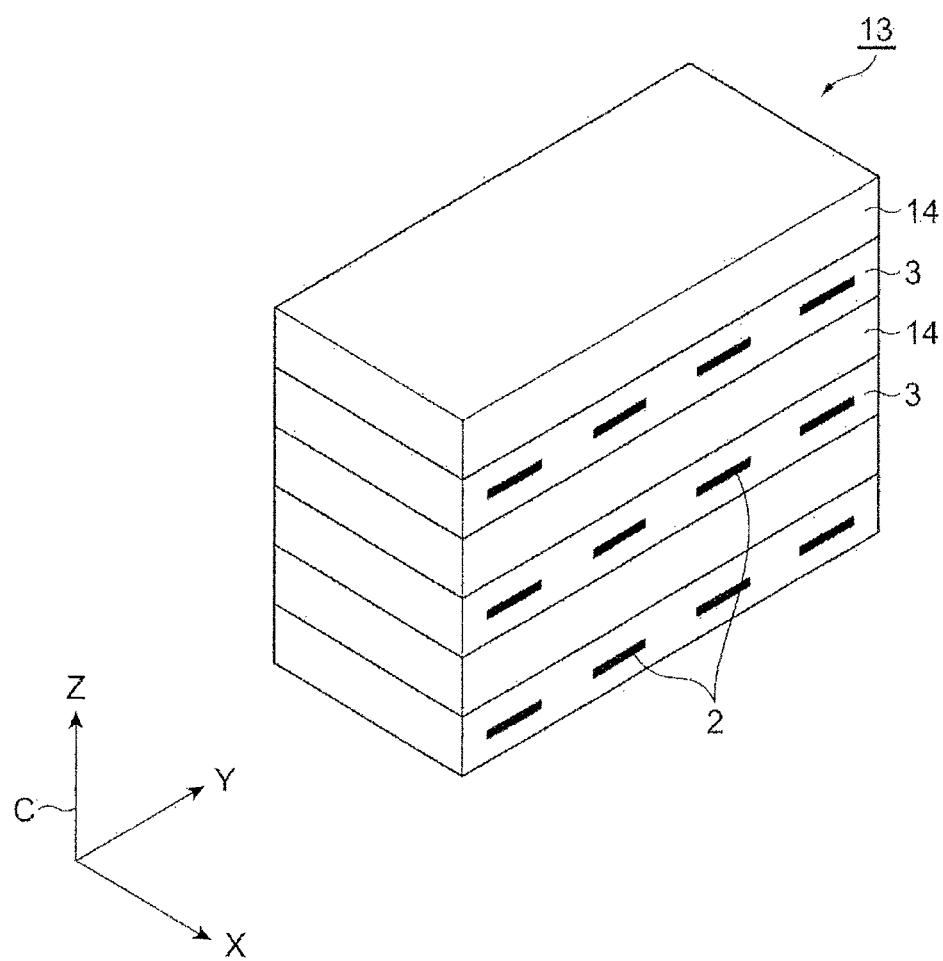
FIG. 7 is a perspective view schematically illustrating a semiconductor laser stack.

In the above-mentioned embodiment, the single semiconductor laser array 3 is provided, but the present invention is not limited to this example. For example, as illustrated in FIG. 7, a semiconductor laser stack 13 may be used instead of the semiconductor laser array 3. The semiconductor laser stack 13 includes a plurality of semiconductor laser arrays 3 which are stacked in the fast axis direction and heat sinks 14 that are disposed between the neighboring semiconductor arrays 3 and 3 and that cool the semiconductor laser arrays 3.

In this case, the collimating lens 5 is disposed in front of each semiconductor laser arrays 3, and the plane mirror 6 (the reflecting surface 7) and the plane mirror 8 (the reflecting surface 9) are disposed to extend over all the stacked semiconductor laser arrays 3. In this way, by disposing the semiconductor laser arrays 3 in a stack shape, the laser lights LB6 having a small divergence angle in the slow axis direction are output from the respective stacked parts. Accordingly, it is possible to obtain laser lights having a small divergence angle and strong light intensity as a whole.

In the above-mentioned embodiment, the second partial lights LB5 advancing to the other side in the slow axis direction from among the laser lights LB2 emitted from the collimating lens 5 are reflected by the reflecting surface 9 of the plane mirror 8, but the present invention is not limited to this example. For example, the wavelength selecting element having the above-mentioned function may be used instead of the plane mirror 8. In this way, by using the wavelength selecting element instead of the plane mirror 8, it is possible to decrease the spectrum width of laser lights to be output.

The above-mentioned embodiments can share the elements as long as there is no particular contradiction or problem. For example, the wavelength selecting element 16 may be used instead of the plane mirror 6 and the wavelength selecting element may be used instead of the plane mirror 8. The semiconductor laser stack 13 may be used instead of the semiconductor laser array 3 and the wavelength selecting element may be used instead of the plane mirror.

The plane mirror 8 mainly reflects the zeroth-order mode lights from among a plurality of mode lights of the second partial lights LB5, but the present invention is not limited to this example. The plane mirror 8 has only to be configured to reflect some mode lights from among the plurality of mode lights of the second partial lights LB5 by the reflecting surface 9. For example, the plane mirror 8 may mainly reflect the first-order mode lights or may reflect both the zeroth-order mode lights and the first-order mode lights.

INDUSTRIAL APPLICABILITY

According to an aspect of the present invention, it is possible to provide a semiconductor laser array that can improve beam quality.

REFERENCE SIGNS LIST

1 . . . semiconductor laser device, 2 . . . active layer, 3 . . . semiconductor laser array, 5 . . . collimating lens, 6 . . . plane mirror (first optical element), 7 . . . reflecting surface (first reflecting surface), 8 . . . plane mirror (second optical element), 9 . . . reflecting surface (second reflecting surface), 16 . . . wavelength selecting element (first optical element), 17 . . . reflecting surface (first reflecting surface), LB3 . . . first partial light, LB5 . . . second partial light, M0 . . . zeroth-order light (partial mode light)

The invention claimed is:

1. A semiconductor laser device comprising:
a semiconductor laser array in which a plurality of active layers that emit laser lights with a divergence angle $\theta_S > 4°$ in a slow axis direction are arranged in the slow axis direction;
a collimating lens that collimates the laser lights emitted from each of the active layers in a plane perpendicular to the slow axis direction;
a first optical element that reflects first partial lights advancing to one side in the slow axis direction from among each of the laser lights emitted from the collimating lens by a first reflecting surface and returns the first partial lights to each of the active layers via the collimating lens; and
a second optical element that reflects a part of the mode lights of a plurality of mode lights of second partial lights advancing to the other side in the slow axis direction from among each of the laser lights emitted from the collimating lens by a second reflecting surface and returns the part of the mode lights to each of the active layers via the collimating lens,
wherein the first optical element is disposed such that the first reflecting surface forms a first angle equal to or greater than 2° and less than $\theta_S/2$ with respect to a plane perpendicular to an optical axis direction of the active layers, and
the second optical element is disposed such that the second reflecting surface forms a second angle greater than $-\theta_S/2$ and equal to or less than $-2°$ with respect to the plane perpendicular to the optical axis direction of the active layers,
wherein the second optical element is disposed in an optical path of zeroth-order mode light from among the plurality of mode lights of the second partial lights to reflect the zeroth-order mode light by the second reflecting surface and to return the zeroth-order mode light to each of the active layers via the collimating lens,
the second optical element is formed to have a width smaller than the width of the second partial lights, and
the second optical element is disposed substantially in the center in the width direction of the optical path of the second partial lights.

2. The semiconductor laser device according to claim 1, wherein the first optical element is a wavelength selecting element that selectively reflects lights having a specific wavelength from among the first partial lights by the first reflecting surface and returns the lights having the specific wavelength to each of the active layers via the collimating lens.

* * * * *